US012768903B2

(12) United States Patent
Cui et al.

(10) Patent No.: US 12,768,903 B2
(45) Date of Patent: Oct. 20, 2026

(54) DETECTION OF CIRCUIT ANOMALIES IN CURRENT TRANSFORMERS

(71) Applicant: Accuenergy (Canada) Inc., Toronto (CA)

(72) Inventors: Shaohang Cui, Toronto (CA); Yufan Wang, Toronto (CA); Ketao Li, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 455 days.

(21) Appl. No.: 18/473,367

(22) Filed: Sep. 25, 2023

(65) Prior Publication Data

US 2025/0102594 A1 Mar. 27, 2025

(51) Int. Cl.
*G01R 31/52* (2020.01)
*G01R 31/62* (2020.01)
(Continued)

(52) U.S. Cl.
CPC ............. *G01R 31/52* (2020.01); *G01R 31/62* (2020.01); *G01R 19/2513* (2013.01); (Continued)

(58) Field of Classification Search
USPC ............................................................ 702/58
See application file for complete search history.

(56) References Cited

U.S. PATENT DOCUMENTS 6,452,767 B1 * 9/2002 Brooks .................. H01R 4/363 361/42
8,847,573 B2 9/2014 Vangool et al.
(Continued)

FOREIGN PATENT DOCUMENTS

| | | |
|---|---|---|
| CN | 115118013 A | 9/2022 |
| CN | 115754879 A | 3/2023 |
| CN | 116299044 A | 6/2023 |

OTHER PUBLICATIONS

Acuvim II Power Meter User Manual, Aug. 2023, V: 3.0.3, Accuenergy (canada) inc., https://accucdn.accuenergy.com/wp-content/uploads/Acuvim-II-Power-Meter-User-Manual-1040E1303.pdf.

*Primary Examiner* — Paul D Lee
(74) *Attorney, Agent, or Firm* — Dhiraj Jindal; PATENT YOGI LLC

(57) ABSTRACT

This invention presents a method for detecting circuit anomalies in a current transformer. The method is executed by a module integrated into an intelligent electronic device. The process involves a multi-step analysis that starts with comparing the frequency of a detected current signal from the transformer's secondary winding with the frequency of a detected voltage signal from a primary conductor. If the frequency difference exceeds a predetermined threshold, the method advances to assess the magnitude of the detected current signal. If this magnitude falls below another predetermined threshold, the method proceeds to analyze the Total Harmonic Distortion (THD) of the current signal. Depending on whether the THD is above or below a set threshold, the method determines the presence of either an open or a short circuit within the current transformer. This approach provides a reliable and accurate means for identifying circuit anomalies, enhancing the safety of electrical systems.

7 Claims, 4 Drawing Sheets

(51) Int. Cl.

| | |
|---|---|
| *G01R 19/25* | (2006.01) |
| *G01R 21/06* | (2006.01) |
| *G01R 31/327* | (2006.01) |
| *G01R 31/67* | (2020.01) |
| *G01R 31/72* | (2020.01) |

(52) U.S. Cl.

CPC .......... *G01R 21/06* (2013.01); *G01R 31/3274* (2013.01); *G01R 31/67* (2020.01); *G01R 31/72* (2020.01)

(56) References Cited

U.S. PATENT DOCUMENTS

| | | | | |
|---|---|---|---|---|
| 11,177,645 | B2* | 11/2021 | Chowdhury | G01R 31/62 |
| 2003/0074148 | A1* | 4/2003 | Dvorak | H02H 1/0015<br>340/657 |
| 2012/0019962 | A1* | 1/2012 | Faxvog | H02H 7/0455<br>327/551 |
| 2013/0279048 | A1* | 10/2013 | Juha | H02H 7/042<br>361/36 |
| 2014/0306716 | A1* | 10/2014 | Ball | G01R 31/62<br>324/538 |
| 2023/0069041 | A1 | 3/2023 | Khan | |

* cited by examiner

DETECTION OF CIRCUIT ANOMALIES IN CURRENT TRANSFORMERS

FIELD OF THE INVENTION

The present invention generally relates to detection of circuit anomalies in a current transformer. The invention also relates to an intelligent electronic device.

BACKGROUND OF THE INVENTION

Current transformers are critical components in various electrical systems, serving to transform high-voltage currents into lower, more manageable levels for measurement or control purposes. Given their pivotal role, the reliable operation of current transformers is essential for the safety and efficiency of electrical systems.

Traditional methods for detecting circuit anomalies in current transformers often involve manual inspections, which are time-consuming and subject to human error. Moreover, these methods usually require the electrical system to be offline, leading to operational disruptions.

There is a growing need for an automated, accurate, and reliable method for detecting circuit anomalies in current transformers.

SUMMARY OF THE INVENTION

The present invention pertains to a sophisticated method and device for the detection of circuit anomalies, specifically open and short circuits, in current transformers. This is achieved through an intelligent electronic device equipped with a specialized measurement module. The module is adept at receiving two types of signals: a current signal that originates from the secondary winding of the current transformer and a voltage signal that is sourced from a primary conductor. Notably, the current transformer is wound around this primary conductor, establishing a unique electrical relationship between them.

Upon receiving these signals, the measurement module initiates a sequence of analytical steps. The first step involves a frequency comparison between the received current and voltage signals. This is not a mere juxtaposition but a rigorous analysis where the difference in frequencies is calculated and compared against a predetermined frequency threshold. If this difference is significant enough to exceed the threshold, the method advances to the next phase of analysis.

The subsequent phase is the assessment of the magnitude of the received current signal. This involves a meticulous comparison against a predetermined magnitude threshold. Falling below this threshold is considered significant and warrants the advancement to the next stage of analysis.

The final analytical stage involves the examination of the Total Harmonic Distortion (THD) inherent in the received current signal. This THD is then contrasted with a predetermined THD threshold. The outcome of this comparison serves as the basis for determining the type of circuit anomaly. An open circuit is identified if the THD exceeds the predetermined threshold, while a short circuit is identified if the THD is below the threshold.

The intelligent electronic device is further equipped with a processor programmed to execute these analytical steps. Additionally, it features a communication interface capable of issuing alerts or triggering protective actions. These alerts can be transmitted to a designated recipient through electronic communication. The protective actions are particularly crucial as they include isolating the affected section of the circuit, thereby preventing further damage when an anomaly is detected.

By employing this multi-step, multi-criteria analytical approach, the invention offers a highly reliable and robust mechanism for detecting circuit anomalies in current transformers. This contributes to enhanced operational safety and system efficiency in various electrical applications.

DETAIL DESCRIPTIONS OF THE INVENTION

Figure 1:
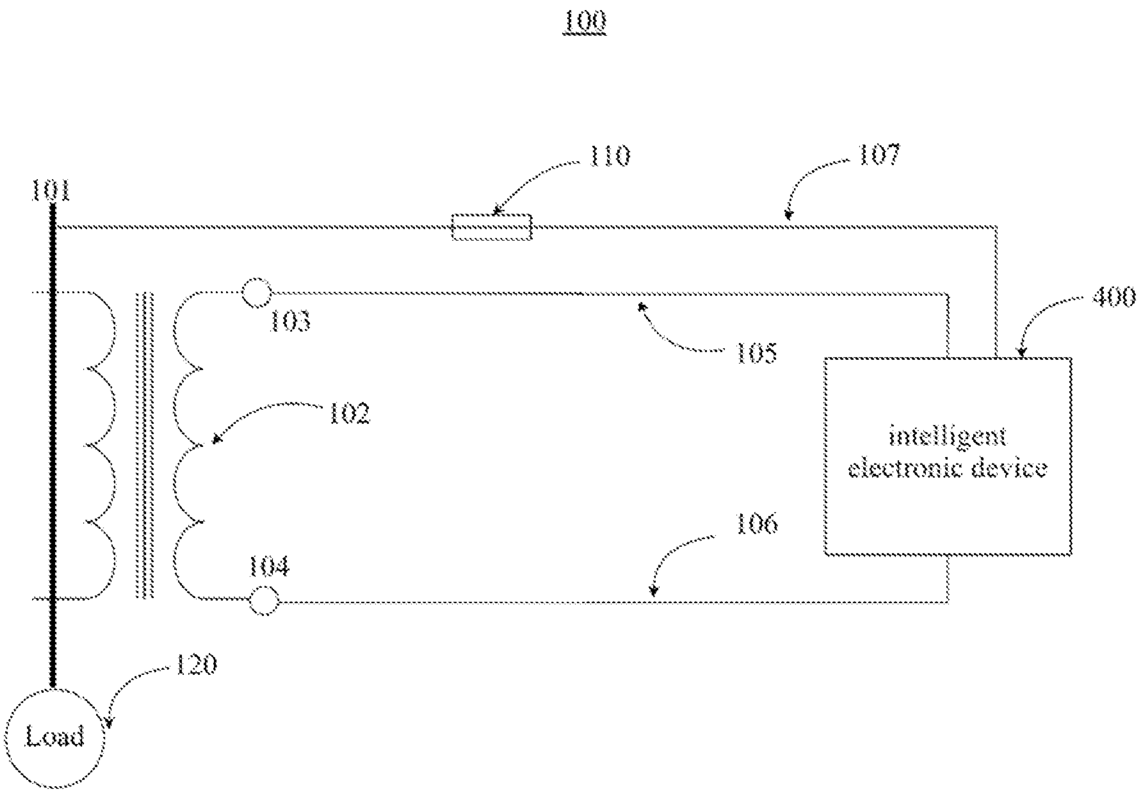
FIG. 1 is a schematic diagram of a current transformer short circuit and open circuit detection system according to some embodiments of the present invention.

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

In the accompanying figures of the present disclosure, identical numerals are used to denote elements that are functionally or structurally equivalent. This approach ensures that elements with the same characteristics are consistently labeled with the same reference numerals across different figures, thereby enhancing the clarity and coherence of the invention's description.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

FIG. 1 is a schematic diagram of a current transformer short circuit and open circuit detection system 100, in accordance with one or more embodiments of the present invention. The system 100 includes a current transformer 102 and an intelligent electronic device 400.

The current transformer 102 is operative to step down the current within an electrical system to a magnitude that can be readily measured and analyzed by instruments such as meters and relays.

In the illustrated embodiment, the system, designated as system 100, additionally comprises two conductive wires, labeled as wires 105 and 106. These wires serve to establish an electrical connection between the intelligent electronic device 400 and secondary terminals 103 and 104. The latter are integral components of the current transformer 102 and are engineered to relay signals that are representative of the electrical current in the secondary winding of the current transformer 102.

The primary conductor 101, around which the current transformer 102 is wound, serves as an integral part of the broader electrical system. This primary conductor 101 is responsible for delivering electrical power to a specific load, identified as load 120. In this context, load 120 could be an Electric Vehicle or any other electrical apparatus requiring monitoring. The current transformer 102 is designed to produce a secondary current that is proportional to the primary current flowing through the primary conductor 101, facilitating accurate measurement or control functions.

Furthermore, system 100 incorporates an additional conductive wire, denoted as wire 107, tasked with capturing the voltage signal present in the primary conductor 101. To enhance the safety features of the system, a protective fuse 110 is installed on wire 107. This fuse is strategically positioned between the intelligent electronic device 400 and the primary conductor 101 to offer circuit protection.

The intelligent electronic device 400 comprises a measurement module 420, which is operable to receive the current signal from current transformer 102 and voltage signals directly from the primary conductor 101, and subsequently generate energy consumption data. Additionally, the measurement module is specifically configured to evaluate the short circuit and open circuit conditions of the current transformer 102. This evaluation is based on signal analysis of the current signal from the current transformer 102 and voltage signal directly from the primary conductor 101.

The intelligent electronic device 400 is equipped with a measurement module 420. This module is designed to perform multiple functions, including but not limited to, receiving electrical current signals from the current transformer 102, as well as voltage signals originating directly from the primary conductor 101. Upon receipt of these signals, the measurement module 420 processes them to generate data related to energy consumption.

Moreover, the measurement module 420 is specially engineered to assess both open and short circuit conditions that may occur within the current transformer 102. This assessment is conducted through a rigorous analysis of the received current signal from the current transformer 102, in conjunction with the voltage signal sourced directly from the primary conductor 101.

Figure 2:
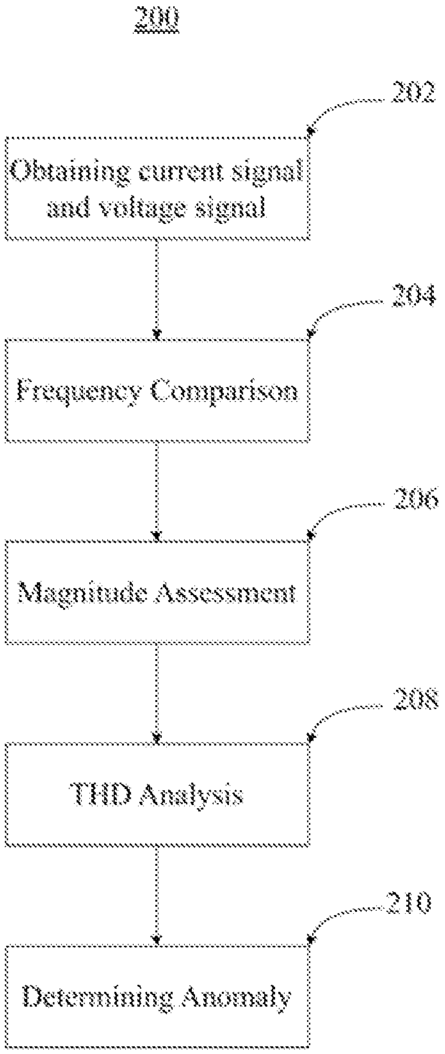
FIG. 2 is a flow chart illustrating a method for detecting open and short circuit conditions in a current transformer using signals analysis according to some embodiments of the present invention.

FIG. 2 illustrates a method 200 for detecting open and short circuit conditions in a current transformer using signals analysis, in accordance with some embodiments. The method starts with obtaining the current signal and voltage signal 202. As depicted in FIG. 1, the current signal is derived from the secondary winding of the current transformer 102. This signal provides a scaled-down representation of the current flowing through the primary conductor, allowing for safer and more manageable measurements. On the other hand, the voltage signal is sourced directly from the primary conductor 101. Both signals are integral to the method as they form the foundational data for the subsequent analytical steps aimed at detecting any open or short circuit conditions within the current transformer.

Following the acquisition of the current and voltage signals, the method advances to the phase of frequency comparison, denoted 204 in FIG. 2. In this critical phase, the frequency of the current signal, obtained from the secondary winding of the current transformer, is meticulously compared with the frequency of the voltage signal sourced from the primary conductor. This comparison serves as a diagnostic tool for identifying any discrepancies that could indicate an underlying issue with the electrical system or the current transformer itself.

The rationale for examining frequency differences is multifaceted. On one hand, an open circuit can induce changes in the parameters of inductance, capacitance, or resistance in the circuit. These changes affect the frequency response and phase relationships of the circuit, potentially altering the resonant frequency or phase difference. On the other hand, a short circuit condition is often simulated by applying a resistor value similar to the burden. In such scenarios, frequency instability is predominantly due to noise. When a new resistor is introduced into the circuit, unstable contacts or a brief settling process may occur, generating noise and leading to temporary frequency instability. However, this condition is generally transient, and the frequency will eventually stabilize back to its normal state.

Advanced signal processing techniques such as Fast Fourier Transform (FFT) and Wavelet Transform are employed to analyze the frequencies, ensuring both accuracy and reliability. FFT is particularly useful for converting the time-domain signals into frequency-domain representations, allowing for more precise frequency comparisons. Wavelet Transform, on the other hand, is effective for analyzing non-stationary or time-varying signals, offering both time and frequency information. If the difference between these frequencies, as analyzed by these techniques, surpasses a predetermined threshold, the method deems it significant enough to warrant further investigation. This threshold can be either statically set or dynamically adjusted by the measurement module, based on real-time data analytics and machine learning algorithms.

In a static setting, the threshold could be established based on empirical data collected from a variety of current transformers operating under normal conditions. This data could be analyzed to determine a frequency discrepancy range within which most normal operations occur. Any frequency discrepancy falling outside this range would then trigger further investigation.

In a dynamic setting, the threshold is adjustable in real-time, leveraging data analytics and machine learning algorithms to adapt to changing conditions. For example, the measurement module could continuously collect and analyze data on the frequency discrepancies observed during normal and anomalous conditions. Machine learning algorithms could then use this data to adjust the threshold in real-time, ensuring that it remains optimally calibrated even as conditions change.

The dynamic adjustment could be particularly useful in environments where the electrical load or other operating conditions are highly variable. It allows the system to adapt to these changes, reducing the likelihood of false positives or negatives. For instance, if the system detects that the electrical load has increased, it might dynamically adjust the threshold upward to prevent false positives.

Both static and dynamic threshold settings aim to balance sensitivity (the ability to correctly identify genuine anomalies) and specificity (the ability to correctly identify normal conditions), thereby minimizing false positives while maximizing true positives. This balance is crucial for the effective operation of the system, ensuring that genuine anomalies are promptly identified and addressed, while avoiding unnecessary alerts or interventions for normal fluctuations.

Advancing past this phase signifies that the method, bolstered by these advanced signal processing techniques, has identified a frequency discrepancy that exceeds acceptable limits, thereby prompting the method to proceed to the next analytical phase for further evaluation.

Following the phase of frequency comparison, the method advances to the stage of magnitude assessment, denoted as 206 in FIG. 2. This stage is of paramount importance as it serves to evaluate the strength or amplitude of the detected current signal from the secondary winding of the current transformer. The assessment is not merely a cursory examination but involves a rigorous comparison of the signal magnitude against a predetermined threshold.

Initially, the predetermined threshold may be set at 15% of the normal magnitude of the detected current signal. This initial setting is derived from empirical data and statistical analysis, taking into account the typical operating conditions of a range of current transformers. However, this is not a rigid setting; it is designed to be adaptable to meet the specific requirements of different electrical systems or user-defined parameters.

The adaptability of the threshold is particularly important for ensuring the method's versatility. For example, in an industrial setting where electrical loads can vary significantly, a static threshold might not be sufficient. In such cases, the threshold could be dynamically adjusted in real-time based on ongoing data analytics. Advanced algorithms could analyze the historical and real-time data to determine the most appropriate threshold setting under the current operating conditions.

Moreover, the threshold could also be adjusted manually by the user to suit specific circuit requirements. For instance, in a sensitive environment where even minor fluctuations could be critical, the user might opt to lower the threshold to ensure that even small anomalies are detected. Conversely, in a more robust system where minor fluctuations are less concerning, the threshold could be set higher to reduce the likelihood of false alarms.

The significance of this magnitude assessment is further underscored by the underlying electrical phenomena that occur during open and short circuit conditions. In the case of an open circuit, the current is unable to flow in the secondary winding of the current transformer. Consequently, the transformer fails to convert the primary current into the corresponding secondary output current, leading to a weakening or near-zero output. This results in a noticeable decrease in the signal magnitude, which is precisely what this stage aims to detect. The 15% magnitude threshold is particularly crucial here as it helps differentiate whether the observed frequency waveform fluctuations are routine or indicative of an open circuit condition.

Similarly, in a short circuit scenario, a resistor with a value similar to the burden is added in parallel to the circuit. This action effectively reduces the total resistance to at least half of its original value, thereby causing a corresponding decrease in the signal magnitude. Much like in the open circuit case, this drop in magnitude serves as a diagnostic marker. It assists in determining whether the frequency waveform fluctuations are routine or are indicative of a short circuit condition.

Some signal processing techniques such as Root Mean Square (RMS) calculation and Peak Detection are employed to ensure the accuracy and reliability of this magnitude assessment. The Root Mean Square calculation is used to statistically measure the magnitude of the varying current signal, providing a more comprehensive view of its overall strength. Peak Detection, on the other hand, identifies the maximum and minimum values of the signal to determine its amplitude, offering a straightforward way to assess magnitude. If the magnitude of the detected current signal, as assessed by these techniques, falls below the predetermined threshold, the method considers it significant enough to warrant further investigation. This threshold can be adjusted as needed, based on real-time analytics or user-defined parameters, to proceed to the next analytical phase for further evaluation.

Upon successfully navigating the magnitude assessment phase, the method progresses to the stage of Total Harmonic Distortion (THD) analysis, denoted as 208 in FIG. 2. This stage is instrumental in providing a nuanced understanding of the quality of the electrical signals, specifically the current signal obtained from the secondary winding of the current transformer. THD analysis involves the calculation and evaluation of the harmonic content in the detected current signal, which is a measure of the distortion introduced into the system. This distortion can be indicative of various anomalies, including but not limited to open and short circuit conditions.

The utility of the THD threshold in diagnosing these conditions is supported by empirical observations. In the case of an open circuit, the THD tends to continuously increase and fluctuate within a certain range. This is because an open circuit at the secondary side prevents the current transformer from providing an accurate secondary output current. The resulting non-linear characteristics, such as frequency changes, contribute to fluctuations in THD.

Conversely, in a short circuit condition, the noise is primarily introduced by the addition of the resistor to the circuit. This noise reaches its maximum level at the moment of introduction and gradually decreases as the circuit stabilizes, eventually dissipating. This leads to a decrease in THD over time, which is why a lower THD can be indicative of a short circuit condition.

In this stage, the THD of the detected current signal is rigorously analyzed and compared against a predetermined THD threshold. This threshold serves as a benchmark for acceptable harmonic distortion levels within the electrical system. If the THD exceeds this predetermined threshold, it is a strong indicator of an open circuit within the current transformer. Conversely, if the THD falls below the predetermined threshold, it is indicative of a short circuit condition within the current transformer.

The predetermined Total Harmonic Distortion (THD) threshold is derived from a set of empirical data, engineering guidelines, and industry standards that define acceptable levels of harmonic distortion in electrical systems. This threshold is often established through rigorous testing and simulation exercises that mimic various operational conditions, including but not limited to, open and short circuit scenarios. These exercises help to identify the THD levels that correspond to healthy and anomalous states of a current transformer, thereby providing a basis for setting a reliable and effective THD threshold.

In some embodiments, the method for detecting circuit anomalies in a current transformer employs a predetermined THD threshold that is not merely a static value but is instead derived from historical data or statistical analysis of typical THD values for similar current transformers. This approach enhances the method's diagnostic accuracy by tailoring the THD threshold to the specific characteristics and operational conditions commonly encountered in similar types of current transformers.

To implement this, the measurement module within the intelligent electronic device could be configured with a database or memory storage that retains historical THD data from either the same current transformer over time or from a variety of similar current transformers. This historical data could include THD values recorded under different load conditions, temperatures, and other environmental factors. Statistical methods such as mean, median, standard deviation, or even more complex machine learning algorithms could be applied to this historical data to derive a THD threshold that is most representative of typical operating conditions for that specific type or class of current transformer.

For example, if the historical data shows that the average THD value for a particular type of current transformer is 5% with a standard deviation of 1%, the system might set the predetermined THD threshold at 7%, which is the average plus two standard deviations. This would mean that any detected THD value exceeding 7% would be considered anomalous, thereby triggering further diagnostic steps as outlined in the method.

Alternatively, the system could employ predictive analytics to adjust the THD threshold dynamically. For instance, if the system has learned from historical data that THD values tend to rise during peak load conditions, it could automatically adjust the threshold upward during those times to avoid false alarms, while still maintaining the sensitivity required to detect genuine anomalies.

By basing the predetermined THD threshold on historical data or statistical analysis, the method gains the ability to adapt to the specific characteristics and common operational conditions of the current transformer it is monitoring. This results in a more accurate and reliable anomaly detection system, capable of differentiating between normal operational variations and genuine circuit anomalies.

Moreover, the predetermined THD threshold can be customized based on the specific requirements of the electrical system in which the current transformer operates. For instance, systems that are more sensitive to harmonic distortion may require a lower THD threshold, while those that can tolerate higher levels of distortion may have a more lenient threshold. This adaptability ensures that the method remains versatile and applicable across a range of different electrical systems and operational conditions.

Advanced mathematical and signal processing techniques such as Fast Fourier Transform (FFT), are employed to ensure the precision and reliability of the THD analysis. The method uses this analysis to make a conclusive determination about the state of the current transformer, whether it is experiencing an open or short circuit condition, thereby guiding subsequent remedial actions.

Following the meticulous analysis of THD, the method culminates in the stage of determining the anomaly, denoted as 210 in FIG. 2. This is the decisive phase where all the preceding analyses coalesce to form a comprehensive diagnostic conclusion about the state of the current transformer. The objective here is to definitively ascertain whether the current transformer is experiencing an open circuit, a short circuit, or is operating within normal parameters.

In this stage, the THD values, which have been rigorously compared against the predetermined THD threshold, serve as the primary diagnostic indicators. If the THD exceeds the predetermined threshold, an open circuit within the current transformer is conclusively determined. This conclusion is supported by the earlier observations that an elevated THD often signifies that the circuit parameters have been altered, possibly due to changes in inductance, capacitance, or resistance, which in turn affects the harmonic content of the signal.

Conversely, if the THD falls below the predetermined threshold, a short circuit within the current transformer is definitively determined. This conclusion is corroborated by the earlier findings that a lower THD could mean that the harmonic components are being shunted or absorbed due to the short circuit, thereby reducing the overall distortion in the signal.

It's important to note that this determination is not made in isolation but is the result of a holistic evaluation that takes into account all the data and insights gathered during the preceding stages of frequency comparison, magnitude assessment, and THD analysis. This ensures that the determination is both accurate and reliable, thereby providing a solid foundation for any subsequent remedial actions that may be required.

In some embodiments, upon determining the presence of either an open circuit or a short circuit within the current transformer, the measurement module 420 is configured to take immediate remedial actions. These actions can be twofold: issuing an alert and triggering a protective action.

For the alert mechanism, the measurement module 420 is equipped with a communication module that is programmed to send out electronic alerts to designated recipients. These recipients can be system administrators, maintenance personnel, or any other stakeholders who need to be informed of the circuit anomaly. The alert can be transmitted through various electronic communication means, such as email, text message, or even directly into a centralized monitoring system. The alert will contain essential information about the nature of the anomaly, the specific location within the electrical system where it occurred, and potentially, recommended immediate actions.

As for the protective action, the system is designed to isolate the affected section of the circuit automatically. This is achieved through the integration of circuit breakers or isolation switches that are controlled by the same intelligent electronic device executing the anomaly detection method. Upon confirmation of an open or short circuit condition, a signal is sent to the circuit breaker or isolation switch, instructing it to open and thereby isolate the affected section of the circuit. This immediate action serves to prevent further damage to the electrical system and enhances the safety measures in place.

Both the alert and protective action mechanisms are designed to work in harmony, ensuring that while the affected circuit section is isolated to prevent further damage, the relevant personnel are informed promptly to take necessary long-term remedial actions. This embodiment thus provides a comprehensive solution for managing circuit anomalies in current transformers.

Figure 3:
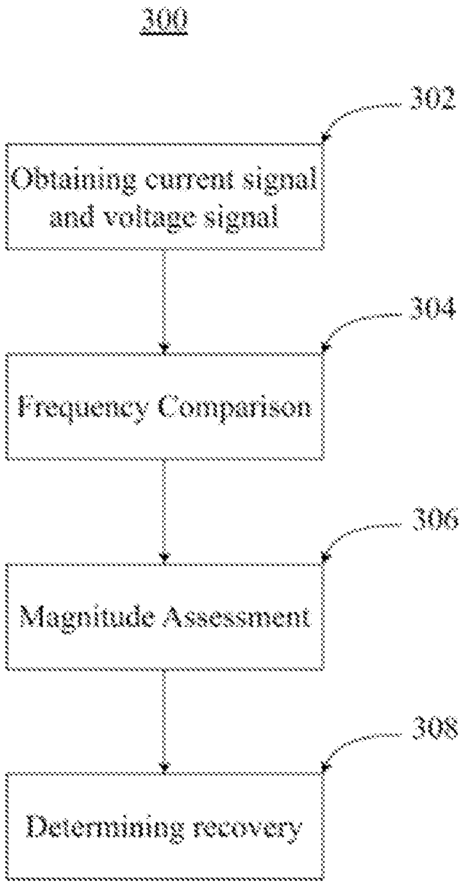
FIG. 3 is a flow chart illustrating a method for determining recovery from short and open circuits within a current transformer according to some embodiments of the present invention.

FIG. 3 illustrates a method, denoted as 300, for determining recovery from short and open circuits within a current transformer, in accordance with some embodiments. This method is an extension of the diagnostic process and serves as a follow-up to the anomaly detection method illustrated in FIG. 2. The method begins with the step of obtaining the current signal and voltage signal, denoted as 302. This initial step is crucial for acquiring the real-time electrical parameters that will be analyzed to assess the recovery status of the current transformer.

Following the acquisition of these signals, the method advances to the stage of frequency comparison, denoted as 304. In this stage, the frequency of the detected current signal is compared with the frequency of the detected voltage signal. The objective here is to ascertain whether the frequencies have stabilized and are in sync, which is a primary indicator of circuit recovery, be it from an open or a short circuit. It's worth noting that the algorithm for determining recovery does not differentiate between open and short circuits based on frequency; the criteria are the same for both.

Subsequent to the frequency comparison, the method progresses to the stage of magnitude assessment, denoted as 306. Here, the magnitude of the detected current signal is rigorously evaluated to determine if it has recovered to a level that is nearly identical to its original state prior to the anomaly. This is a critical step as the recovery of the magnitude to its original level serves as a strong indicator that the circuit has recovered from either an open or a short circuit condition.

The final stage of the method is determining recovery, denoted as 308. In this decisive phase, the method employs a set of criteria to conclusively ascertain the recovery status of the current transformer. For short circuit recovery, the frequency should be stable and equal to the corresponding voltage frequency for a predetermined period. This condition should always be true for a circuit recovering from a short. Once this criterion is met and the magnitude has recovered to almost the same level as before the drop, the circuit is determined to have recovered from a short circuit. However, if an unstable frequency and an increase in THD are detected during what was assumed to be a short, the circuit will be reclassified as an open circuit.

For open circuit recovery, the circuit is determined to remain open unless two conditions are met: the current frequency must be equal to the corresponding voltage frequency for a predetermined period, and the magnitude must recover to its original level. Only when both these conditions are satisfied is the circuit considered to have recovered from an open circuit.

In some embodiments, the system incorporates a feature that allows for the adjustment of the predetermined period required for recovery based on the severity of the detected anomaly. This feature enhances the system's adaptability and responsiveness to varying conditions.

Upon detecting an open or short circuit within the current transformer, the system categorizes the severity of the anomaly. This categorization can be based on several factors, such as the magnitude of the detected current signal, the extent of Total Harmonic Distortion (THD), or even historical data related to similar anomalies. The severity level is then used to dynamically adjust the predetermined period that must elapse for recovery to be considered.

For instance, in cases where the anomaly is deemed to be of high severity, the system may require a longer period during which the frequency of the detected current signal must match the frequency of the detected voltage signal. This extended period ensures that the system has adequately stabilized before recovery is confirmed. Conversely, for anomalies categorized as low severity, the system may shorten the predetermined period, allowing for quicker recovery and resumption of normal operations.

This dynamic adjustment is executed by an algorithm within the intelligent electronic device responsible for anomaly detection. The algorithm takes into account the categorized severity and adjusts the predetermined period in real-time, thereby tailoring the recovery process to the specific conditions at hand.

By allowing the predetermined period for recovery to be adjustable based on the severity of the detected anomaly, this embodiment provides a more nuanced and adaptive approach to managing circuit anomalies in current transformers. It ensures that the system's response is proportionate to the severity of the condition, optimizing both safety and operational efficiency.

In summary, FIG. 3 outlines a method for determining recovery from short and open circuits within a current transformer. The method employs a series of analytical steps, each serving a specific purpose in the recovery assessment process. It utilizes the same frequency and magnitude criteria for both open and short circuits, thereby streamlining the algorithm. Advanced signal processing techniques and decision-making algorithms are employed to ensure the accuracy and reliability of this recovery determination, thereby providing a robust and effective means of assessing the operational status of a current transformer post-anomaly.

Figure 4:
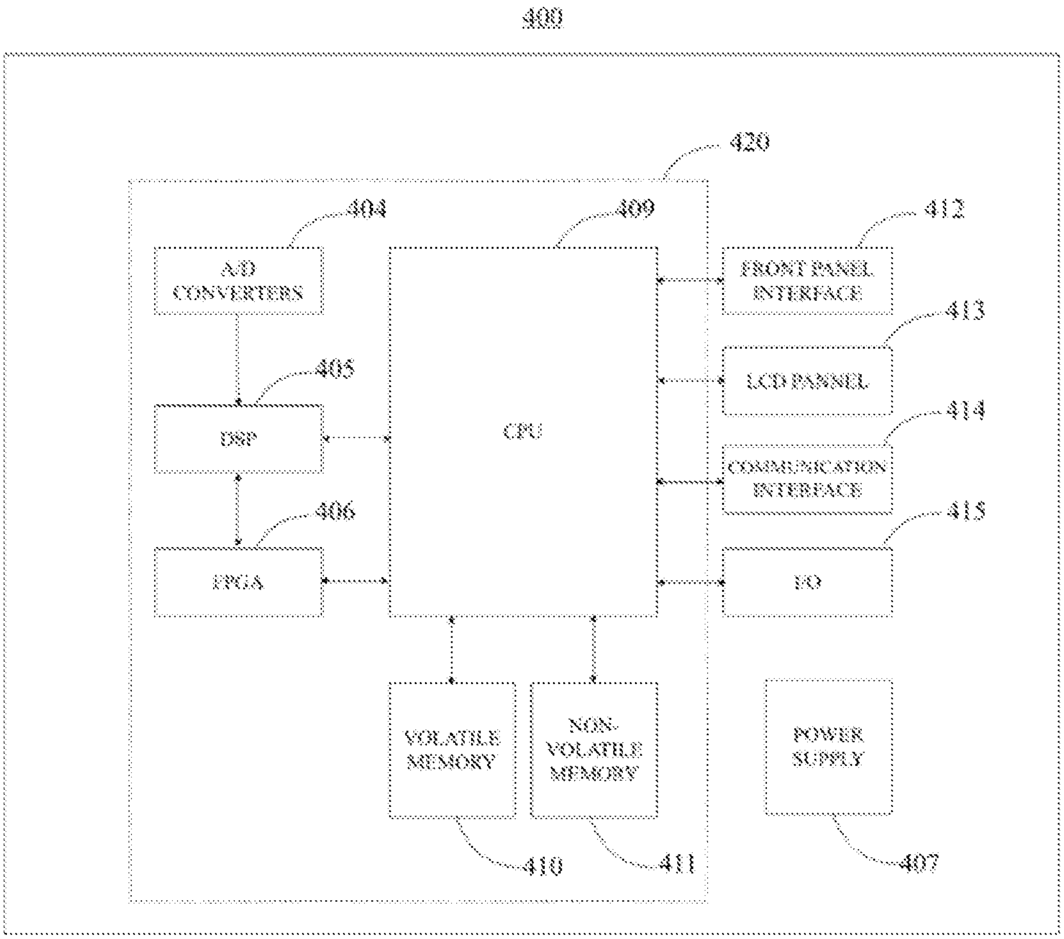
FIG. 4 is a block diagram of an intelligent electronic device for monitoring power usage and power quality for any metered point within a power system according to some embodiments of the present invention.

FIG. 4 is a block diagram of an intelligent electronic device 400 for monitoring power usage and power quality for any metered point within a power system.

The intelligent electronic device 400 illustrated in FIG. 4 includes multiple analog-to-digital (A/D) converters 404, a power supply 407, volatile memory 410, non-volatile memory 411, a front panel interface 412, and a processing module that includes at least one Central Processing Unit (CPU) and/or one or more Digital Signal Processors (DSP), two of which are shown DSP 405 and CPU 409. The intelligent electronic device 400 also includes a Field Programmable Gate Array (FPGA) 406 which performs several functions, including acting as a communications bridge for transferring data between the various processors (405 and 409).

The output of a current transformer or potential transformer will be coupled with the A/D converters 404 which are configured to convert the analog voltage output from the transformer to a digital signal that can be processed by the DSP 405. The voltage signal directly from the primary conductor 101 may be initially processed by voltage dividers to bring the high voltage levels down to a range suitable for the A/D converters.

A/D converters 404 are configured to convert an analog voltage output to a digital signal that is transmitted to a gate array, such as Field Programmable Gate Array (FPGA) 406. The digital signal is then transmitted from the FPGA 406 to the CPU 409.

The CPU 409 or DSP Processors 405 are configured to receive digital signals from the A/D converters 404 and perform the necessary calculations to determine power usage and control the overall operations of the intelligent electronic device 400. In some embodiments, the CPU 409 and DSP 405 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 406. In some embodiments, the digital samples, which are output from the A/D converters 404 are sent directly to the CPU 409, effectively bypassing the DSP 405 and the FPGA 406 as a communications gateway.

The power supply 407 provides power to each component of the intelligent electronic device 400. In one embodiment, the power supply 407 is a transformer with its primary windings coupled to the incoming power distribution lines to provide a nominal voltage at its secondary windings. In other embodiments, power may be supplied from an independent power source to the power supply 407.

The front panel interface 412 is shown coupled to the CPU 409 which includes indicators, switches, and various inputs. The LCD panel 413 is shown coupled to the CPU 409 for interacting with a user and for communicating events, such as alarms and instructions. The LCD panel 413 may provide information to the user in the form of alpha-numeric lines, computer-generated graphics, videos, animations, etc.

An input/output (I/O) interface 415 may be provided for receiving externally generated inputs from the intelligent electronic device 400 and for outputting data, such as serial data, to other devices. In one embodiment, the I/O interface 415 may include a connector for receiving various cards and/or modules that increase and/or change the functionality of the intelligent electronic device 400.

The intelligent electronic device 400 also includes volatile memory 410 and non-volatile memory 411. The volatile memory 410 will store the sensed and generated data for further processing and for retrieval when requested to be displayed at the intelligent electronic device 400 or from a remote location. The volatile memory 410 includes internal storage memory, such as Random-Access Memory (RAM). The non-volatile memory 411 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including timestamps), and stored digital samples for later download to a client application, web-server, or PC application.

In a further embodiment, the intelligent electronic device 400 will include a communication interface 414, also known as a network interface, for enabling communications between the meter, and a remote terminal unit or programmable logic controller and other computing devices, microprocessors, desktop computers, laptop computers, other meter modules, etc. The communication interface 414 may be a modem, Network Interface Card (NIC), wireless transceiver, or other interface. The communication interface 414 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The intelligent electronic device 400 may communicate to a server or other computing device via the communication interface 414. The intelligent electronic device 400 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one IED or meter and/or storing data to be retrieved by the IED or meter.

In an additional embodiment, when a power event occurs, such as a voltage surge, voltage sag, or current short circuit, the intelligent electronic device 400 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 409 to compute other electrical parameters such as harmonics, magnitudes, symmetrical components, and phasor analysis.

In a further embodiment, the intelligent electronic device 400 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which intelligent electronic device firmware and/or software can be upgraded. An event command can be issued by a user, on a schedule, or through a digital communication that will trigger the intelligent electronic device 400 to access a remote server and obtain the new program code. This will ensure that program data will be maintained, assuring the user that all information is displayed identically on all units.

The foregoing description pertains to a general-purpose intelligent electronic device, designated as element 400, engineered for the measurement of energy consumption. Within this intelligent electronic device 400, hardware components such as ADC 404, DSP 405, FPGA 406, CPU 409, volatile memory 410, and non-volatile memory 411 collectively constitute the hardware aspect of the measurement module 420. This hardware aspect is integrally described in the context of mechanisms for open circuit and short circuit detection. In addition, the measurement module 420 also encompasses a software aspect, where functional attributes corresponding to these detection mechanisms may be executed either in DSP 405 or CPU 409 via software implementation. Implementation of the measurement module, which includes both hardware and software components, is straightforward for those skilled in the art, thereby obviating the need for further elaboration on this aspect.

The detailed description above sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

The teams and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A method for detecting circuit anomalies in a current transformer, executed by a measurement module that is part of an intelligent electronic device, comprising:

comparing the frequency of a detected current signal originating from the secondary winding of the current transformer with the frequency of a detected voltage signal sourced from a primary conductor around which the current transformer is wound, and advancing to a next step if the difference between the frequencies surpasses a predetermined frequency threshold;

assessing the magnitude of the detected current signal and advancing to a next step if the magnitude falls below a predetermined magnitude threshold;

analyzing the Total Harmonic Distortion (THD) of the detected current signal and contrasting it with a predetermined THD threshold, subsequently determining:

an open circuit within the current transformer if the THD exceeds the predetermined THD threshold, a short circuit within the current transformer if the THD is below the predetermined THD threshold; and triggering, by the intelligent electronic device, a protective action that includes isolating an affected section of a circuit to prevent further damage when either the open circuit or the short circuit within the current transformer is determined.

2. The method for detecting circuit anomalies in a current transformer of claim 1, further comprising:

determining recovery from the open circuit or the short circuit within the current transformer by: comparing a stabilized frequency of the detected current signal with the frequency of the detected voltage signal, wherein both frequencies must be equal for a predetermined period for recovery to be considered valid;

assessing the recovery of the magnitude of the detected current signal to its original level prior to the open circuit or the short circuit, wherein recovery is confirmed if the magnitude returns to a level within a predetermined percentage range of its original state.

3. The method for detecting circuit anomalies in a current transformer of claim 2, wherein the predetermined period for recovery is adjustable based on the severity of the detected anomaly.

4. The method for detecting circuit anomalies in a current transformer of claim 1, wherein the predetermined magnitude threshold is set at a percentage of a normal magnitude of the detected current signal.

5. The method for detecting circuit anomalies in a current transformer of claim 1, wherein the predetermined THD threshold is based on historical data or statistical analysis of typical THD values for normal current transformers.

6. The method for detecting circuit anomalies in a current transformer of claim 1, further comprising:

issuing an alert when either the open circuit or the short circuit within the current transformer is determined, wherein the alert is transmitted to a designated recipient via electronic communication.

7. An intelligent electronic device configured to detect circuit anomalies in a current transformer, the device comprising:

a measurement module configured to receive a current signal originating from the secondary winding of the current transformer and a voltage signal sourced from a primary conductor around which the current transformer is wound;

a processor programmed to execute the following steps:

comparing the frequency of the received current signal with the frequency of the received voltage signal, and advancing to a next step if the difference between the frequencies surpasses a predetermined frequency threshold;

assessing the magnitude of the received current signal and advancing to a next step if the magnitude falls below a predetermined magnitude threshold;

analyzing the Total Harmonic Distortion (THD) of the received current signal and contrasting it with a predetermined THD threshold, subsequently determining:

an open circuit within the current transformer if the THD exceeds the predetermined THD threshold, a short circuit within the current transformer if the THD is below the predetermined THD threshold;

a communication interface configured to trigger a protective action that includes isolating an affected section of a circuit to prevent further damage when either the open circuit or the short circuit within the current transformer is determined.

* * * * *